United States Patent
Sofer et al.

(10) Patent No.: US 8,552,778 B2
(45) Date of Patent: Oct. 8, 2013

(54) DUTY CYCLE CORRECTOR AND DUTY CYCLE CORRECTION METHOD

(75) Inventors: Sergey Sofer, Reshon Letzion (IL); Eyal Melamed-Kohen, Modiin (IL); Valery Neiman, Rishon Lezion (IL)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/392,638

(22) PCT Filed: Sep. 24, 2009

(86) PCT No.: PCT/IB2009/054186
§ 371 (c)(1),
(2), (4) Date: Feb. 27, 2012

(87) PCT Pub. No.: WO2011/036516
PCT Pub. Date: Mar. 31, 2011

(65) Prior Publication Data
US 2012/0169391 A1    Jul. 5, 2012

(51) Int. Cl.
*H03K 3/017*    (2006.01)

(52) U.S. Cl.
USPC .......................................................... 327/175

(58) Field of Classification Search
USPC .................................................. 327/172–176
See application file for complete search history.

(56) References Cited

U.S. PATENT DOCUMENTS

| | | | |
|---|---|---|---|
| 5,638,016 A * | 6/1997 | Eitrheim | 327/175 |
| 6,525,581 B1 * | 2/2003 | Choi | 327/175 |
| 6,566,925 B2 * | 5/2003 | Ma | 327/175 |
| 6,882,196 B2 | 4/2005 | Yee et al. | |
| 6,956,420 B2 * | 10/2005 | Slawecki | 327/172 |
| 6,977,536 B2 * | 12/2005 | Chin-Chieh et al. | 327/116 |
| 7,180,346 B2 | 2/2007 | Lee | |
| 7,184,509 B2 | 2/2007 | Cho et al. | |
| 7,432,752 B1 | 10/2008 | Lee et al. | |
| 2003/0201806 A1 * | 10/2003 | Cho | 327/116 |
| 2009/0284293 A1 | 11/2009 | Kim et al. | |

OTHER PUBLICATIONS

Huang Hong-Yi et al: Low-Power 50% Duty Cycle Corrector Circuits and Systems, 2008. ISCAS 2008. IEEE International Symposium, May 18-21, 2008, Seattle, WA, pp. 2362-2365.
International Search Report and Written Opinion correlating to PCT/IB2009/054186 dated Jun. 24, 2010.

* cited by examiner

*Primary Examiner* — William Hernandez

(57) ABSTRACT

The invention relates to a duty cycle corrector for generating from an input clock signal an output clock signal having a desired duty cycle. The duty cycle corrector comprises a pulse generating stage for generating from the input clock signal a pulsed clock signal. The pulse generating stage converts rising edges of the input clock signal into pulses, each of which pulses is shorter than the desired duty cycle times the clock period. The duty cycle corrector further comprises a pulse stretching stage for generating from the pulsed clock signal the output clock signal, the pulse stretching stage delaying falling edges of the pulsed clock signal by a controlled delay. The duty cycle corrector may comprise a duty cycle detector for generating a control signal as a function of the duty cycle of the output clock signal, and a feedback path for delivering the control signal to the pulse stretching stage so as to increase the controlled delay when the duty cycle is less than the desired duty cycle and to decrease the controlled delay when the duty cycle is greater than the desired duty cycle. The invention also relates to a method of generating from an input clock signal an output clock signal having a desired duty cycle.

24 Claims, 9 Drawing Sheets

US 8,552,778 B2

DUTY CYCLE CORRECTOR AND DUTY CYCLE CORRECTION METHOD

FIELD OF THE INVENTION

This invention relates to a duty cycle corrector for generating from an input clock signal an output clock signal having a desired duty cycle.

The invention also relates to a synchronous circuit comprising such a duty cycle corrector.

The invention further relates to a method of generating from an input clock signal an output clock signal having a desired duty cycle.

BACKGROUND OF THE INVENTION

In a synchronous digital system, different components of the system are synchronized by means of a clock signal. A clock signal is a succession of high and low values. Typically, the high values are provided by a high voltage level while the low values are provided by a low voltage level. The clock signal is typically periodic, both for the sake of simplicity and to maximize the number of operations per second performed by the synchronous circuit. The clock signal can take the form of a square wave, a sinusoidal wave, a succession of pulses, or any other function which oscillates between a low value (low) and a high value (high). Transitions in the clock signal from low to high and from high to low are termed rising edges and falling edges, respectively. The components of the synchronous digital system may be triggered by only rising edges, or only falling edges, or by both rising edges and falling edges. The period of the clock signal and its inverse are referred to, respectively, as the clock period and the clock frequency. The clock period and the clock frequency may be measured in, e.g., seconds and Hertz, respectively. The time between a rising edge and the subsequent falling edge, divided by the clock period, is known as the duty cycle of the clock signal. In the case of a synchronous system which utilizes both rising and falling edges of the clock signal, the duty cycle must be neither too small nor too large. Typically, the duty cycle is desired to be approximately 50%. In the case where the clock signal is not a square wave, the rising edges and the falling edges can be defined, for example, by referring to the instants at which the value of the clock signal is the average of its low value and its high value when the clock signal passes from a low to a high or from a high to a low, respectively.

An available clock signal does not necessarily have the desired duty cycle. For example, a clock may generate a clock signal having a duty cycle of 30% which is adapted for the majority of components of the synchronous system, while one component of the system requires a duty cycle of 50%. In another example, a clock signal having originally a duty cycle of 50% is transmitted over a clock tree. Components of the clock tree may affect the quality of the clock signal such that the duty cycle of the clock signal delivered to a particular component of the synchronous digital system has a duty cycle different from 50%. In both cases, a clock signal having a desired duty cycle of 50% can be recovered from the original clock signal by means of a duty cycle corrector. The duty cycle corrector receives the original clock signal (input clock signal) and generates from it an output signal having the same frequency as the input clock signal and having the desired duty cycle.

Referring to FIGS. 1 to 4, there are illustrated a method and a circuit for generating from an input clock signal an output clock signal having a desired duty cycle, according to the prior art. Both the input clock signal CLKIN and the output clock signal CLK_50 are provided in the form of a voltage V which periodically oscillates between a low value and a high value as a function of time t. During an interval of length T1 the input clock signal CLKIN is high. During an interval of length T2 the input clock signal CLKIN is low. The clock period is T=T1+T2. The duty cycle of the input clock signal CLKIN is T1/T.

Referring now specifically to FIG. 1, the duty cycle T1/T of the input clock signal is 20%. The output clock signal CLK_50 is generated from the input clock signal CLKIN by transmitting rising edges with essentially no delay while delaying falling edges by 30% of the clock period T. The output clock signal CLK_50 thus has a duty cycle T1'/T of 50% as desired. The delay by which falling edges of the input clock signal CLKIN are delayed may of course be adjusted in this manner so as to obtain a duty cycle of the output clock signal CLK_50 having any desired value.

Referring now specifically to FIG. 2, the duty cycle of the input clock signal CLKIN is T1/T=80%. An output clock signal CLK_50 having a duty cycle T1'/T of 50% is generated from CLKIN by delaying rising edges of CLKIN while transmitting falling edges with essentially no delay. The rising edges of the output clock signal CLK_50 thus generated are seen to be delayed with respect to the corresponding rising edges of the input clock signal CLKIN by a duration Δt which in the present example is 30% of the clock period T. This delay Δt depends on the difference between the duty cycle of the input clock signal and the desired duty cycle. In this sense, the output clock signal CLK_50 has an unspecified delay Δt with respect to the input clock signal CLKIN. This can be problematic in a synchronous digital system, where it is usually required that rising edges at different points of a clock tree occur simultaneously. In other words, the output clock signal CLK_50 has an undetermined phase relative to the input clock signal CLKIN.

Huang et al., in "Low-Power 50% Duty Cycle Corrector" circuit and systems, 2008, pages 2362 to 2365 (2008), have presented a duty cycle corrector for implementing the method described above with reference to FIGS. 1 and 2. That duty cycle corrector is briefly described with reference to FIG. 3. The duty cycle corrector 10 comprises a control stage 14, 16, 18, 20, 22, 24 with input at node 12 and output at node 26, a buffer chain 28, 30, 32 with input at node 26 and output at node 34, a duty cycle detector 36, 38, 40, 42, 44, 46, 48 with input at node 34 and output at node 58, and a feedback path 50 from node 58 to the gate of a PMOS transistor 18 and an NMOS transistor 20 of the control stage. The control stage 14, 16, 18, 20, 22, 24 is essentially a CMOS inverter comprising the PMOS transistor 14 and the NMOS transistor 16, wherein the source of PMOS transistor 14 is coupled via a PMOS transistor 18 to a high bias potential 22 while NMOS transistor 16 is coupled to a low bias potential 24 via an NMOS transistor 20. If transistors 18 and 20 where perfectly conductive, the control stage would simply invert the clock signal CLKIN received at node 12 to deliver an inverted clock signal at node 26, by converting high into low, and low into high. However, transistors 18 and 20 are controlled by means of control voltage VCTL generated at the capacitor 40 by the duty cycle detector. The higher VCTL, the higher will be the conductivity of NMOS transistor 20 and the lower will be the conductivity of PMOS transistor 18. Conversely, the lower VCTL, the higher will be the conductivity of PMOS transistor 18 and the lower will be the conductivity of NMOS transistor 20. Thus, by varying VCTL, the rise time and the fall time of the control stage 12, 14, 16, 20, 26 can be controlled. More specifically, the higher VCTL, the faster a high-to-low transition at node 26 and the slower a low-to-high transition at node 26 will be. Conversely, the lower VCTL, the faster a low-to-high transition and the slower a high-to-low transition will be. Depending on the value of VCTL, the control stage thus delays predominantly either rising edges or falling edges of the input clock signal CLKIN to produce a raw output clock signal CLKR. If the input clock signal CLKIN is a square wave, the raw output clock signal CLKR is not. A square wave signal CLK_50 is recovered from CLKR by passing the latter through the chain of buffers 28, 30, 32.

The duty cycle detector comprises the capacitor 40, a first current source 36, a second current source 38, a PMOS transistor 42 coupled to the first current source 36, and an NMOS 44 transistor coupled to the second current source 38. It is coupled between a high bias potential 46 and a low bias potential 48 and operates as follows. When the potential at node 34, i.e. the output of the buffer chain 28, 30, 32, is high, NMOS transistor 44 but not PMOS transistor 42 is conductive and the second current source 38 lowers the voltage at the capacitor 40. Conversely, when the potential at node 34 is low, PMOS transistor 42 but not NMOS transistor 44 is conductive and the first current source 36 increases the voltage at capacitor 40. When the duty cycle of the output clock signal CLK_50 is 50%, the voltage at capacitor 40 will remain constant when averaged over one clock period.

The control stage, the buffer chain, the duty cycle detector, and the feedback path 50 together form a closed loop causing the control voltage VCTL to converge to an average value such that the output clock signal CLK_50 assumes a duty cycle of 50%. A duty cycle different from 50% could be achieved by, for example, using current sources 36, 38 producing currents I1 and I2 respectively, such that T1×I1=T2×I2 where T1 and T2 are the durations of the high and the low in the desired output signal, respectively.

Illustrated in FIG. 4 is an output clock signal CLKOUT obtained from an input clock signal CLKIN using a prior art duty cycle corrector as shown in FIG. 3. In plot (a), (b), and (c), the duty cycle of the input clock signal CLKIN is 80%, 50%, and 20%, respectively. In plot (a) the output clock signal CLKOUT is retarded relative to the input clock signal CLKIN by 30% of the clock period.

SUMMARY OF THE INVENTION

The present invention provides a duty cycle corrector and a duty cycle correction method as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. Elements in the figures are illustrated for simplicity and clarity and have not necessarily been drawn to scale. Like reference numerals indicate like or similar elements throughout the figures.

DETAILED DESCRIPTION OF PREFERRED EMBODIMENTS

Because the apparatus implementing the present invention is, for the most part, composed of electronic components and circuits known to those skilled in the art, circuit details will not be explained in any greater extent than that considered necessary for the understanding and appreciation of the underlying concepts of the present invention and in order not to obfuscate or distract from the teachings of the present invention.

Figure 5:
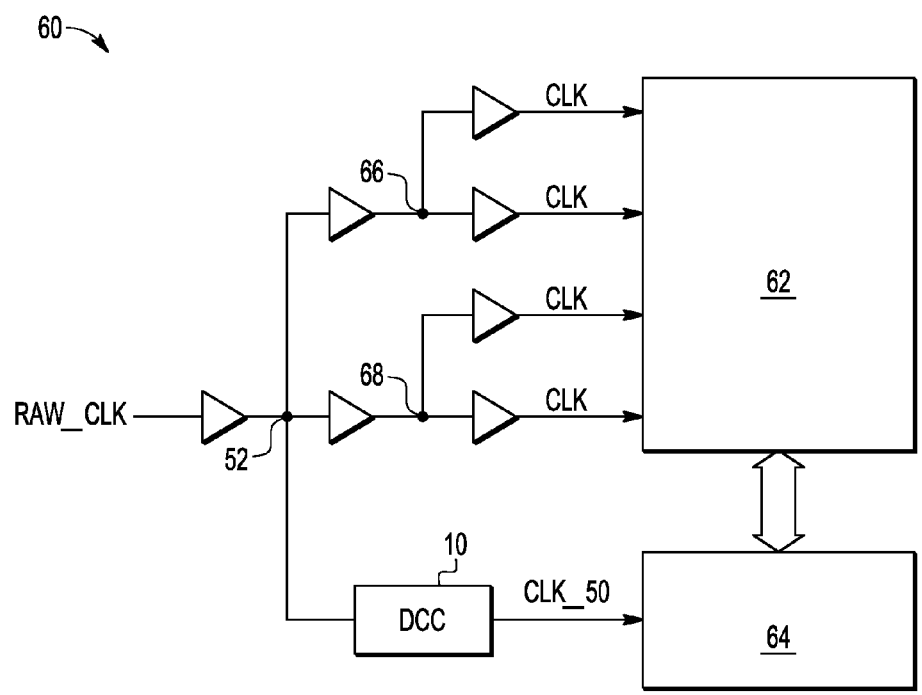
FIG. 5 schematically illustrates an example of a synchronous digital system.

Shown in FIG. 5 is an example of a synchronous digital system 60 comprising, by way of example, a processing unit 62 and a memory 64 operably coupled to each other. A raw clock signal RAW_CLK is fed to the processing unit 62 and to the memory 64 via a clock tree comprising nodes 52, 66, and 68, to provide the processing unit 62 and the memory 64 with clock signals CLK and CLK_50, respectively. The clock branch to the memory 64 comprises a duty cycle corrector 10 that will be described below with reference to FIGS. 7 to 11.

Figure 6:
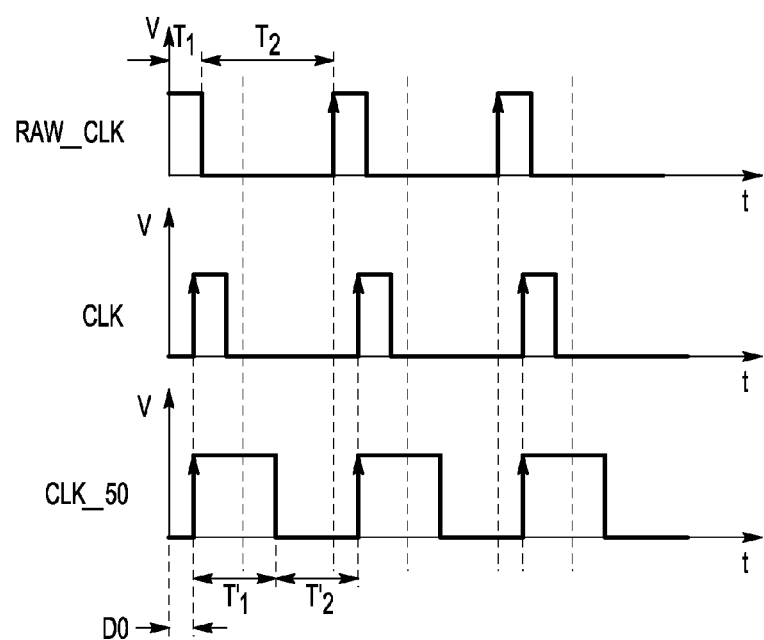
FIG. 6 schematically illustrates generation of a clock signal having a desired duty cycle in the synchronous digital system shown in FIG. 5.

The clock signals CLK and CLK_50 fed to the processing unit 62 and to the memory 64 are schematically plotted in FIG. 6. The raw clock signal RAW_CLK has a duty cycle T1/(T1+T2) of 20%. The clock signal CLK delivered at the processing unit 62 differs from the raw clock signal RAW_CLK only in that it is retarded by a delay D0 induced by the clock tree. The clock signal CLK_50 (specifically its rising edge) delivered to the memory 64 differs from the raw clock signal RAW_CLK in that it is retarded by a delay D0' induced by a special branch of the clock tree and further in that its duty cycle has been corrected by the duty cycle corrector 10 (having an intrinsic delay D0" so that D0'+D0"=D0) to T1'/(T1'+T2')=50%. It is pointed out that in the example shown, the rising edge of the clock signal CLK is synchronized with the rising edge of the clock signal CLK_50 to ensure a proper interaction between the processing unit 62 and the memory 64.

Beyond the scope of the specific exemplary architecture shown in FIG. 5, a duty cycle corrected clock signal may be used in other duty cycle sensitive sub-circuits, such as memories, processors, and other single edge or dual edge triggered blocks, wherein the rising edge is synchronized with the rising edge of clock signals and the rest of sub-circuits. The same is also true for falling edge triggered circuits.

Illustrated with reference to FIGS. 7 to 11 are a method and a corresponding device for generating from an input clock signal an output clock signal having a desired duty cycle.

Figure 1:
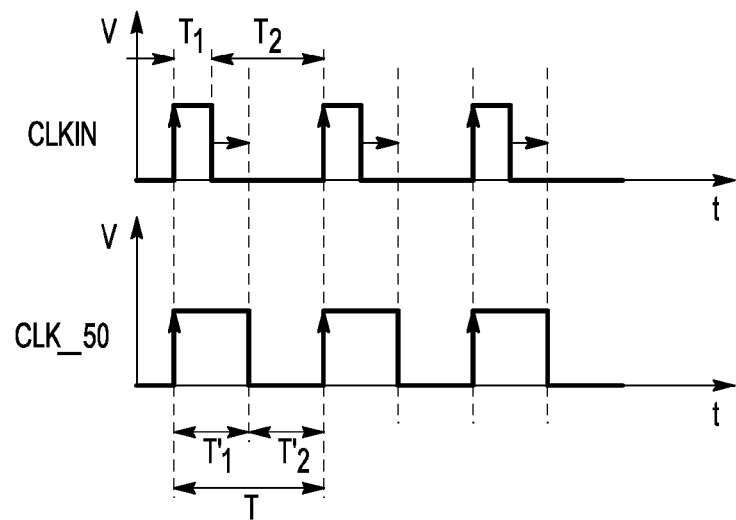
FIG. 1 schematically illustrates generation of a clock signal having a 50% duty cycle from a clock signal having a duty cycle smaller than 50%.
Figure 2:
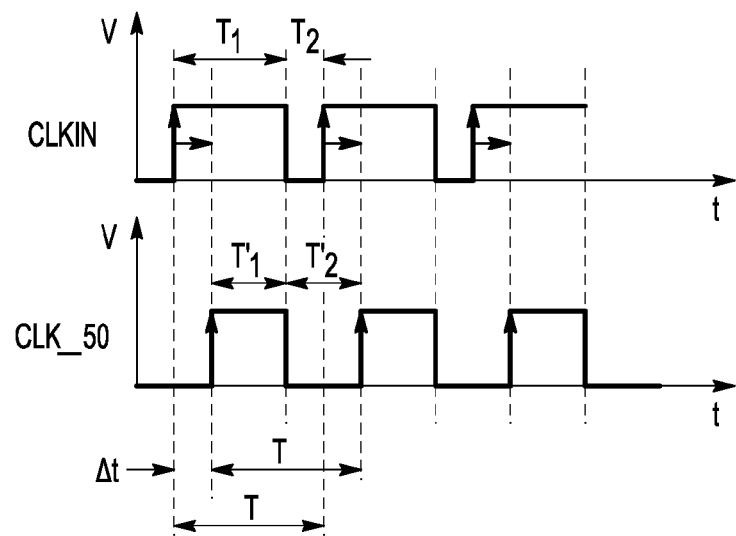
FIG. 2 schematically illustrates generation of a clock signal having a 50% duty cycle from a clock signal having a duty cycle greater than 50%.
Figure 7:
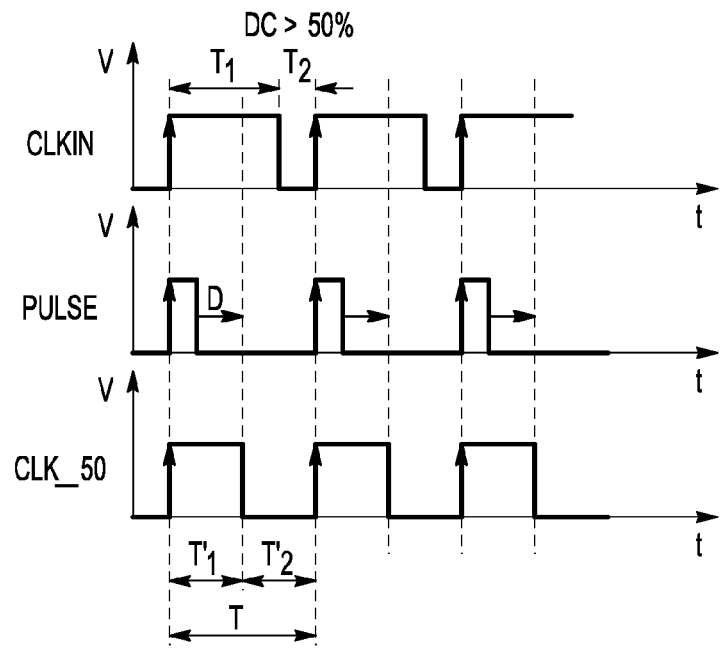
FIG. 7 schematically illustrates generation of a clock signal having a duty cycle of 50% from a clock signal having a greater duty cycle.

Referring specifically to FIG. 7, the method is illustrated for the case of an input clock signal having a duty cycle greater than 50%. In the example, as in the other examples of the description, the input clock signal CLKIN as well as the output clock signal CLK_50 and intermediate signals are provided by a voltage V which varies as a function of time t. In the method, rising edges of the input clock signal CLKIN are converted into pulses to generate from the input clock signal CLKIN a pulsed clock signal PULSE. In this context, the term "convert" should be interpreted in a broad sense. In particular, it may comprise detecting rising edges of the input clock signal CLKIN and triggering a pulse upon detection of a rising edge. Alternatively or additionally, it may comprise shaping the input clock signal CLKIN. Each of the pulses is shorter than the desired duty cycle times the clock period T. The pulses may be delayed with respect to the original rising edges of the input clock signal by a fixed first delay. In the example shown, the first delay is too short to be discerned. That is, in the example shown, the rising edge of the input clock signal CLKIN and the rising edge of the pulsed signal PULSE occur quasi-simultaneously. From the pulsed clock signal PULSE the output clock signal CLK_50 is generated by delaying falling edges of the pulsed clock signal PULSE by a controlled delay. The controlled delay is also referred to herein as third delay. Rising edges of the pulsed clock signal are delayed by a fixed second delay. The third delay is longer than the second delay. In the plot, the second delay is too short to be discerned. The first delay and the second delay are fixed in the sense that they are design constants rather than controlled quantities. They may, of course, vary as a function of external parameters such as temperature. For many applications, it may be advantageous that the first delay and the second delay be as short as possible, ideally zero. The difference between the second delay and the third delay is chosen such that the duty cycle T1'/T of the resulting clock signal CLK_50 has the desired value. In the example shown, the desired duty cycle is 50%. In the example, the delay of the rising edges of the output clock signal relative to the rising edges of the input clock signal is the sum of the first delay and the second delay, and it is short compared to the clock period. In this context, "short" may mean, for example, less than the following: 10%, 3%, 1%, 0.3%, or 0.1% of the clock period. In contrast to the prior art duty cycle corrector described above with reference to FIGS. 1 to 3, the delay of the rising edges of the output clock signal relative to the rising edges of the input clock signal is independent of the duty cycle of the input clock signal.

Figure 8:
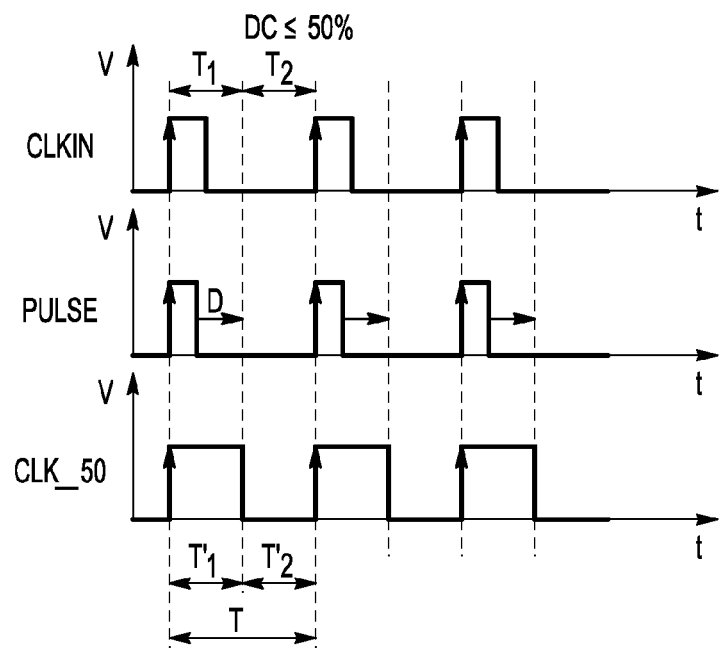
FIG. 8 schematically illustrates generation of a clock signal having a duty cycle of 50% from a clock signal having a smaller duty cycle.

FIG. 8 illustrates the method for the case in which the duty cycle of the input clock signal CLKIN is smaller than the desired duty cycle. In the present example, the desired duty cycle is again 50% but the input clock signal CLKIN has a duty cycle of only 20%. Again, in the manner described above with reference to FIG. 7, rising edges of the input clock signal are converted into pulses to obtain a pulsed clock signal PULSE. As in FIG. 7, each of the pulses is shorter than the desired duty cycle (50% in the present example) times the clock period T. Each of the pulses is delayed with respect to the original rising edge of the input clock signal CLKIN (i.e. the rising edge from which the pulse originated) by the fixed first delay which in the present example is negligibly short compared to the clock period T. Rising edges and falling edges of the pulsed clock signal PULSE are then delayed (as described with reference to FIG. 7) by the fixed second delay (negligible in the example) and the controlled third delay D, respectively, to obtain the output clock signal CLK_50 having the desired duty cycle of 50%.

It is noted that the present method differs substantially from the duty cycle correction method proposed in U.S. Pat. No. 6,882,196 B2 in particular in that the output clock signal CLK_50 is generated by "shaping" the pulsed signal PULSE. More specifically, the output clock signal CLK_50 is generated on the basis of both rising edges and falling edges of the pulsed signal PULSE. Rising edges of the pulsed signal PULSE are converted into rising edges of the output clock signal CLK_50. Falling edges of the pulsed clock signal PULSE are converted into falling edges of the output clock signal CLK_50. In contrast, in the method according to U.S. Pat. No. 6,882,196 B2, falling edges of the output clock signal are triggered by delayed edges in a pulsed signal, wherein the delayed edges are either falling or rising edges, whereas rising edges of the output clock signal are triggered by rising edges of the input clock signal.

Figure 9:
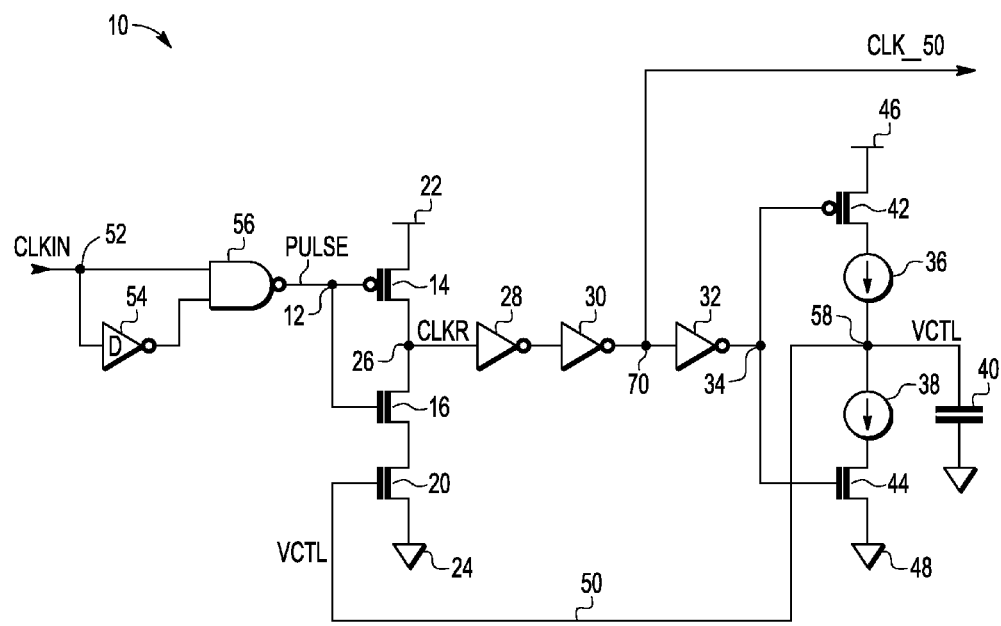
FIG. 9 schematically illustrates an example of a duty cycle corrector comprising a pulse generating stage.

Referring now to FIG. 9, there is shown in a schematic and simplified manner a duty cycle corrector 10 for generating from an input clock signal CLKIN an output clock signal CLK_50 having a desired duty cycle. The duty cycle corrector 10 differs from the prior art duty cycle corrector 10 discussed with reference to FIG. 3 chiefly in that it comprises a pulse generating stage 52, 54, 56 for generating from the input clock signal CLKIN a pulsed clock signal PULSE. The pulse generating stage 52, 54, 56 is adapted to convert rising edges of the input clock signal CLKIN into pulses, each of which pulses is shorter than the desired duty cycle times the clock period (i.e. shorter than the desired high time of the input clock signal CLKIN). Furthermore, each of the pulses is delayed with respect to the original rising edge of the input clock signal by a fixed first delay. The first delay may be as short as possible and may be negligible compared to the clock period. For example, the first delay may be shorter than 10%, 3%, 1%, 0.3%, or 0.1% of the clock period. The first delay is fixed in the sense that it is a design characteristic. Notably the first delay is not controlled by a control loop. In the example shown, the pulse generating stage 52, 54, 56 comprises a delay-and-inversion branch 54 for delaying and inverting the input clock signal CLKIN to generate an inverted and delayed clock signal. The pulse generating stage 52, 54, 56 further comprises an AND gate or a NAND gate 56 arranged to receive as first input the input clock signal and as second input the inverted and delayed input clock signal. The gate 56 will thus output a high (in the case of an AND gate) or a low (in the case of a NAND gate) if and only if both the first input and the second input are high, which is the case if and only if the input clock signal is high and the delayed input clock signal is low, i.e. whenever the input clock signal CLKIN passes from low to high. In the present example, the gate 56 is a NAND gate and the resulting pulse is a low pulse. The pulsed clock signal PULSE in FIG. 9 is thus inverted as compared to the pulsed clock signal PULSE plotted in FIGS. 7 and 8. In other words, a high in the pulsed clock signal PULSE in FIGS. 7 and 8 corresponds to a low in the pulsed clock signal PULSE in FIG. 9, and vice versa. If the gate 56 were an AND gate, the resulting pulse would be a high pulse. The duration of the pulse is determined by the delay imposed on the input clock signal CLKIN in the delay-and-inversion branch 54.

Figure 3:
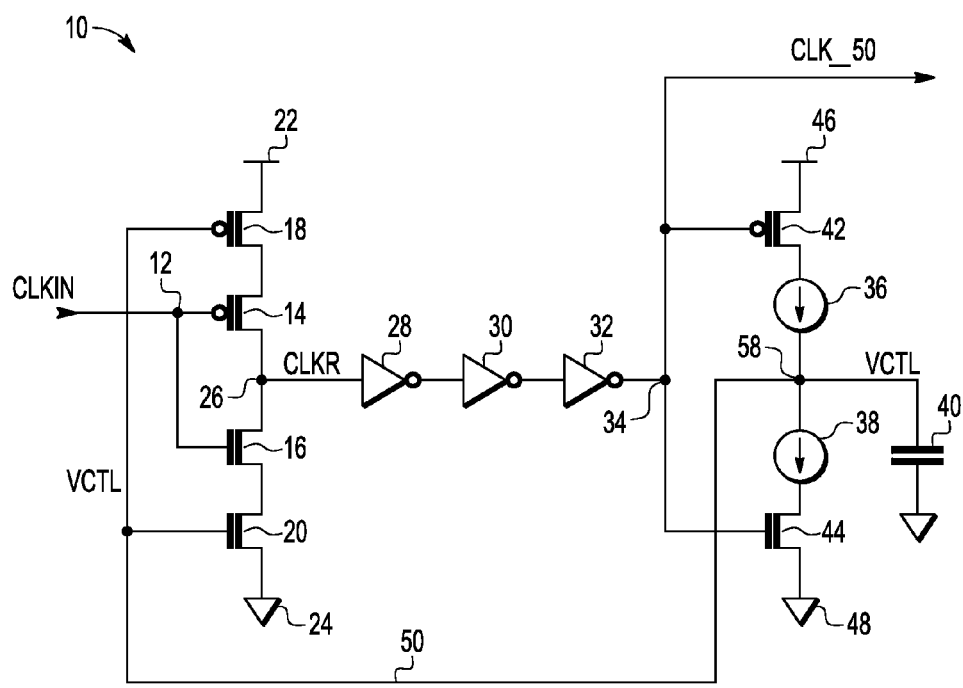
FIG. 3 schematically illustrates an example of a prior art duty cycle corrector.
Figure 4:
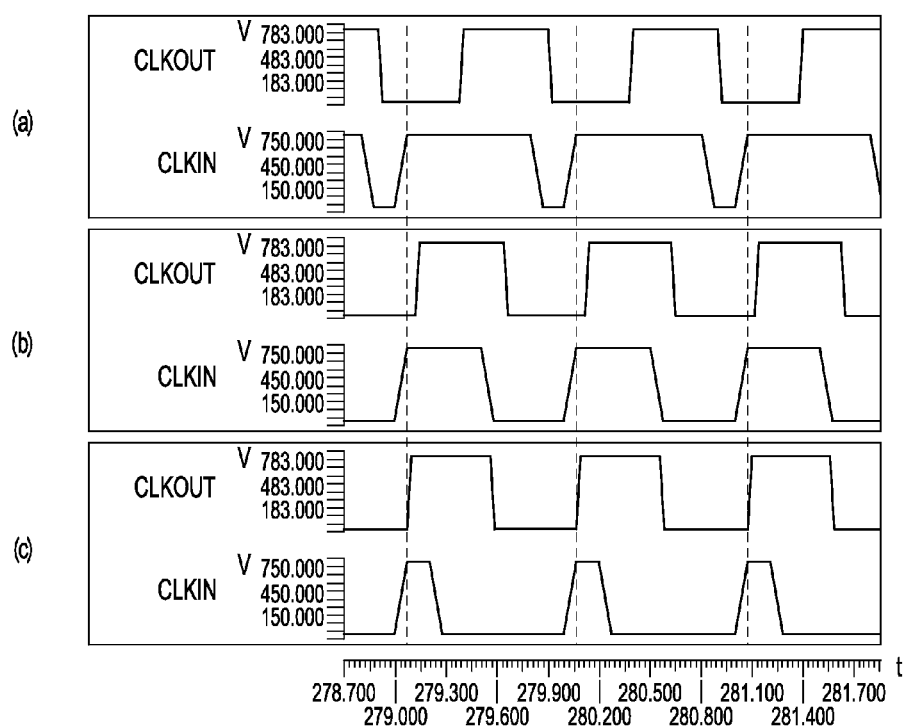
FIG. 4 schematically illustrates plots of clock signals generated experimentally with a duty cycle corrector as shown in FIG. 3.

The pulsed clock signal PULSE delivered by the pulse generating stage 52, 54, 56 may be input to the duty cycle corrector 10 shown in FIG. 3. However, in the present example, the pulsed clock signal PULSE is fed to a modified circuit, with input at node 12 and output at node 70. The modified circuit 12, 14, 16, 20, 26, 70 is referred to herein as pulse stretching stage and is described in the following.

It is recalled that the circuit shown in FIG. 3 is adapted to delay rising edges as well as falling edges to modify the duty cycle. In contrast, the present pulse stretching stage 12, 14, 16, 20, 26, 70 shown in FIG. 9, with input at node 12 and output at node 70, is adapted to transfer rising edges with substantially no delay and to substantially delay only falling edges. An equivalent design working with inverted signals would substantially delay rising edges and transfer falling edges with no unnecessary delay. The pulse stretching stage 12, 14, 16, 20, 26, 70 shown in FIG. 9 generates from the pulsed clock signal PULSE the output clock signal CLK_50, by delaying falling edges of the pulsed clock signal PULSE by a controlled delay. Rising edges are delayed by a fixed second delay which is shorter than the controlled delay. The first delay as well as the second delay may be negligibly short compared to the clock period, whereas the controlled delay will generally be non-negligible and determines the duty cycle of the resulting output signal CLK_50.

The pulse stretching stage 12, 14, 16, 20, 26, 70 comprises a control stage 12, 14, 16, 20, 26 for generating from the pulsed clock signal a raw output clock signal CLKR. The control stage 12, 14, 16, 20, 26 has a controllable rise time or a controllable fall time. In other words, the duration of a low-to-high transition or the duration of a high-to-low transition at node 26 is controllable. In the example shown, the fall time at node 26, i.e. the duration of a transition from high bias potential 22 to low bias potential 24, is controllable by means of the control voltage VCTL. The control stage 12, 14, 16, 20, 26 comprises a CMOS inverter 12, 14, 16, 26 analogous to the CMOS inverter described with reference to FIG. 3. The CMOS inverter 12, 14, 16, 26 comprises a first PMOS transistor 14 for outputting a high (the high bias potential 22) and a first NMOS transistor 16 for outputting a low (the low bias potential 24). In the present example, the control stage 12, 14, 16, 20, 26 further comprises a second NMOS transistor 20 coupled between the source of the first NMOS transistor 16 and the low bias potential 24, so that the fall time of the control stage is a function of the gate-to-source voltage at the second NMOS transistor 20. In an alternative design in which the pulsed clock signal PULSE is made of high pulses, a second PMOS transistor (analogous to PMOS transistor 18 in FIG. 3) could be coupled between the source of the first PMOS transistor 14 and the high bias potential 22, so that the rise time of the control stage would be a function of the gate-to-source voltage at the second PMOS transistor. In contrast to the design described above with reference to FIG. 3, the source of the first PMOS transistor 14 is shortened to the high bias potential 22. Thereby the rise time at node 26 and hence the second delay introduced above are minimized. In the above-mentioned alternative design in which the control stage comprises the second PMOS transistor (analogous to PMOS transistor 18 in FIG. 3) to control the rise time of the control stage rather than its fall time, the source of the first NMOS transistor 16 may be shortened to the low bias potential 24.

The pulse stretching stage 12, 14, 16, 20, 26, 70 further comprises a refinement stage 28, 30 for generating from the raw output clock signal CLKR the output clock signal CLK_50. It is noted that in the example shown, the raw output clock signal CLKR delivered by the control stage at node 26 is not a square wave because the high-to-low transitions of the control stage are stretched. The refinement stage 28, 30 may be adapted to shape the raw output clock signal CLKR so as to obtain an output clock signal CLK_50 in the form of, for example, a square wave. To this end, the refinement stage may comprise at least one of: a buffer, an amplifier, a comparator, or a Schmitt trigger. Each of these elements may be inverting or non-inverting. In the example shown, the refinement stage comprises a first buffer 28 and a second buffer 30 coupled in series. The output clock signal CLK_50 is delivered at node 70 at the output of the second buffer 30.

A third buffer 32 transfers the output clock signal CLK_50 to a duty cycle detector 34, 36, 38, 40, 42, 44, 46, 48. The duty cycle detector generates a control signal as a function of the duty cycle of the output clock signal CLK_50. In the present exemplary design, the control signal is provided by the control voltage VCTL. Feedback path 50 delivers the control signal to the pulse stretching stage 12, 14, 16, 20, 26, 70 so as to increase the controlled delay when the duty cycle of the output clock signal CLK_50 is less than the desired duty cycle and to decrease the controlled delay when the duty cycle is greater than the desired duty cycle. In the example shown, the controlled delay is the sum of the rising edge delay induced by the control stage 14, 16, 20, 26 and a fixed additional delay possibly induced by the refinement stage 28, 30. The duty cycle detector 34, 36, 38, 40, 42, 44 comprises a capacitor 40, a first current source 36 coupled so as to increase the charge of the capacitor 40 when the output clock signal CLK_50 is high, and a second current source 38 coupled so as to reduce the charge of the capacitor 40 when the output clock signal CLK_50 is low. In the example, the first current source 36 and the second current source 38 are identical in construction in order to deliver equal but opposed currents, corresponding to a desired duty cycle of 50%.

The duty cycle corrector 10 may be implemented as or form part of an integrated circuit.

Figure 10:
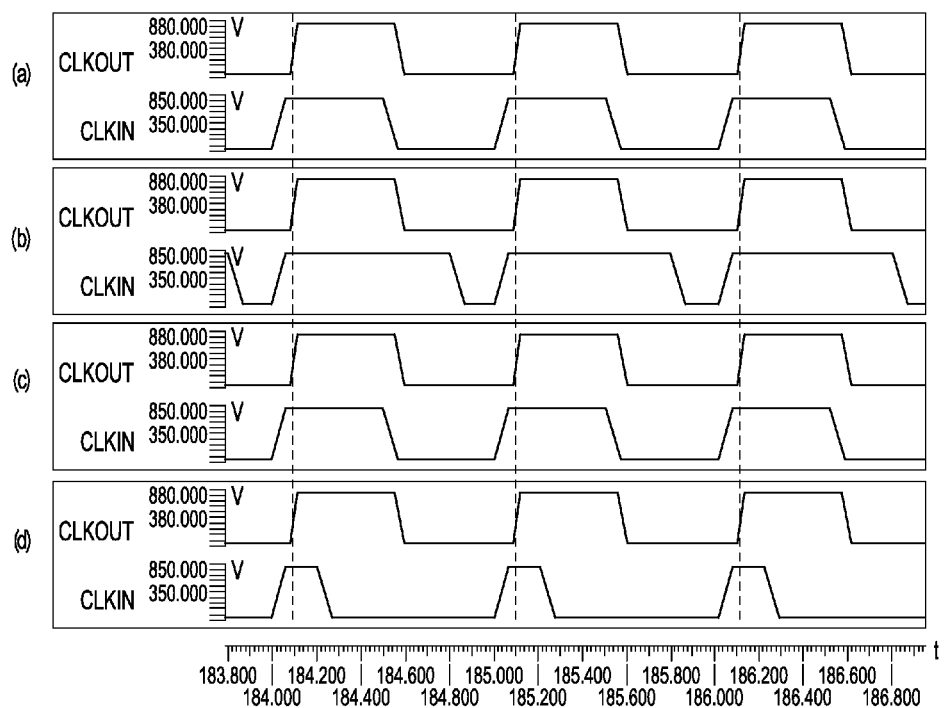
FIG. 10 schematically illustrates plots of clock signals generated by a duty cycle corrector as shown in FIG. 9.

FIG. 10 shows plots of input clock signals CLKIN and corresponding output clock signals CLKOUT generated experimentally using a duty cycle corrector 10 as described above with reference to FIG. 9. The circuitry of the duty cycle corrector shown in FIG. 9 was implemented using 45 nanometers silicon-on-insulator (SOI) technology. The circuit provided a synchronous clock having a duty cycle of 50% within an acceptable tolerance of +/−2.5% for frequencies of 200 MHz to 2 GHz in all combinations of voltage, temperature, and manufacturing process corner. In plot (a) the duty cycle corrector is by-passed. The by-pass circuitry is not shown for simplicity, but the structure, based on a slight modification of the pulse generator, is clear to those skilled in the art. The output clock signal CLKOUT is seen to be identical to the input clock signal CLKIN up to a small delay. In plots (b), (c), and (d), the input clock signal CLKIN has a duty cycle of 80%, 50%, and 20%, respectively. In each case the duty cycle corrector correctly generates an output clock signal CLKOUT (denoted CLK_50 in FIG. 9) having a duty cycle of 50% and having a small fixed delay relative to the CLKIN rising edge, identical to the delay in plot (a).

Figure 11:
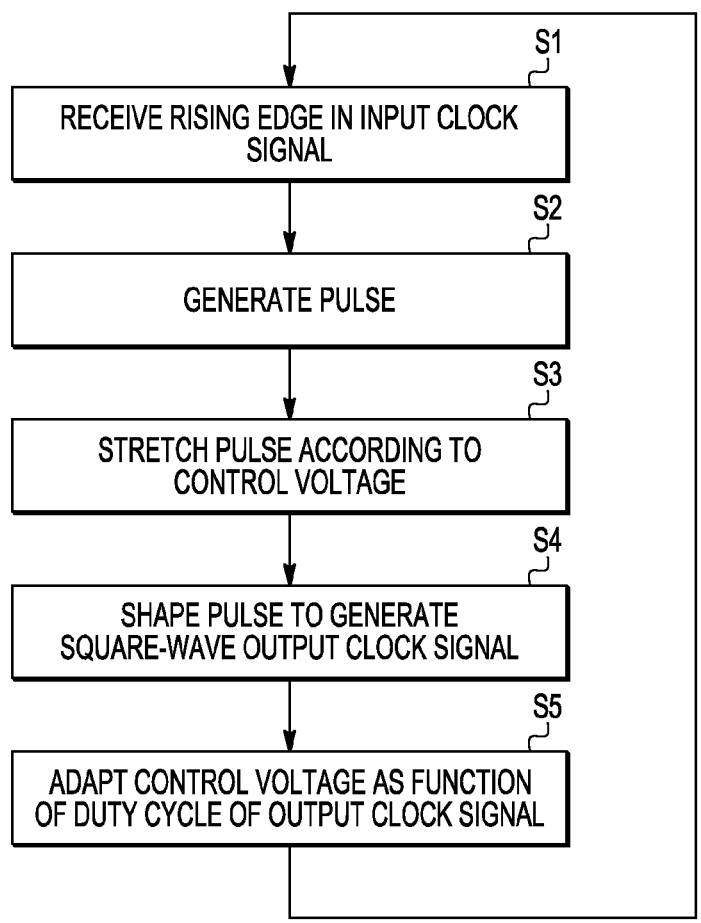
FIG. 11 is a schematic flow chart illustrating an example of a duty cycle correction method.

The flow chart in FIG. 11 further illustrates, by way of example, the proposed method of generating an output clock signal having a desired duty cycle. The method comprises: generating (S2) from the input clock signal a pulsed clock signal, by converting rising edges of the input clock signal into pulses, each of which pulses is shorter than the desired duty cycle times the clock period and delayed with respect to the original rising edge of the input clock signal by a fixed first delay; and generating (S3, S4) from the pulsed clock signal the output clock signal, by delaying rising edges and falling edges of the pulsed clock signal by a fixed second delay and a controlled third delay, respectively, wherein the third delay is longer than the second delay. In the example shown, the method further comprises controlling (S5) the third delay so as to converge the duty cycle of the output clock signal to the desired duty cycle.

In step S1, a rising edge in an input clock signal is received. The rising edge is converted into a pulse (S2). The pulse is stretched according to a control voltage (S3). The pulse is shaped to generate a square wave output clock signal (S4). The control voltage is adapted as a function of the duty cycle of the output clock signal (S5). The process then returns to step S1.

The terms "rising edge" and "falling edge" are not absolute but a matter of sign convention. Indeed, by inverting a clock signal, a high-to-low transition is converted into a low-to-high transition, and vice versa. The terms "rising edge" and "falling edge" are therefore interchangeable.

Each of the pulse generating stage, the pulse stretching stage, the duty cycle detector, and the feedback path described above may be implemented by any kind of means adapted to achieve the same functionality. For example, the delay-and-inversion branch 54 and the NAND gate 56 are exemplary rather than necessary components of the pulse generating stage 52, 54, 56. Similarly, the CMOS inverter 12, 14, 16, 26, the second NMOS transistor 20, and the buffers 28, 30 are described merely to illustrate a specific possible design of the pulse stretching stage 12, 14, 16, 26, 70. The person skilled in the art may opt for a different design for each of the pulse generating stage, the pulse stretching stage, the duty cycle detector, and the feedback path.

The invention may also be implemented in a computer program for running on a computer system, at least including code portions for performing steps of a method according to the invention when run on a programmable apparatus, such as a computer system or enabling a programmable apparatus to perform functions of a device or system according to the invention. The computer program may for instance include one or more of: a subroutine, a function, a procedure, an object method, an object implementation, an executable application, an applet, a servlet, a source code, an object code, a shared library/dynamic load library and/or other sequence of instructions designed for execution on a computer system. The computer program may be provided on a data carrier, such as a CD-rom or diskette, stored with data loadable in a memory of a computer system, the data representing the computer program. The data carrier may further be a data connection, such as a telephone cable or a wireless connection.

In the foregoing specification, the invention has been described with reference to specific examples of embodiments of the invention. It will, however, be evident that various modifications and changes may be made therein without departing from the broader spirit and scope of the invention as set forth in the appended claims. For example, the connections may be any type of connection suitable to transfer signals from or to the respective nodes, units or devices, for example via intermediate devices. Accordingly, unless implied or stated otherwise the connections may for example be direct connections or indirect connections.

The terms "assert" or "set" and "negate" or "invert" (or "deassert" or "clear") are used herein when referring to the rendering of a signal, status bit, or similar apparatus into its logically true or logically false state, respectively. If the logically true state is a logic level one, the logically false state is a logic level zero). And if the logically true state is a logic level zero, the logically false state is a logic level one.

Each signal described herein may be designed as positive or negative logic, where negative logic can be indicated by a bar over the signal name or an asterisk (*) following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Although the invention has been described with respect to specific conductivity types or polarity of potentials, skilled artisans appreciated that conductivity types and polarities of potentials may be reversed.

Some of the above embodiments, as applicable, may be implemented using a variety of different information processing systems. For example, although FIG. 1 and the discussion thereof describe an exemplary information processing architecture, this exemplary architecture is presented merely to provide a useful reference in discussing various aspects of the invention. Of course, the description of the architecture has been simplified for purposes of discussion, and it is just one of many different types of appropriate architectures that may be used in accordance with the invention. Those skilled in the art will recognize that the boundaries between logic blocks are merely illustrative and that alternative embodiments may merge logic blocks or circuit elements or impose an alternate decomposition of functionality upon various logic blocks or circuit elements.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Also for example, in one embodiment, the illustrated elements of system 10 are circuitry located on a single integrated circuit or within a same device. Alternatively, system 10 may include any number of separate integrated circuits or separate devices interconnected with each other. For example, the pulse generating stage 52, 54, 56 may be located on a same integrated circuit as the pulse stretching stage 12, 14, 16, 20, 26, 70 or on a separate integrated circuit or located within another peripheral or slave discretely separate from other elements of system 10. Also for example, system 10 or portions thereof may be soft or code representations of physical circuitry or of logical representations convertible into physical circuitry. As such, system 10 may be embodied in a hardware description language of any appropriate type.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Also, the invention is not limited to physical devices or units implemented in non-programmable hardware but can also be applied in programmable devices or units able to perform the desired device functions by operating in accordance with suitable program code. Furthermore, the devices may be physically distributed over a number of apparatuses, while functionally operating as a single device.

Other modifications, variations and alternatives are also possible. The specifications and drawings are, accordingly, to be regarded in an illustrative rather than in a restrictive sense.

In the claims, any reference signs placed between parentheses shall not be construed as limiting the claim. The word "comprising" does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements The mere fact that certain measures are recited in mutually different claims does not indicate that a combination of these measures cannot be used to advantage.

The invention claimed is:

1. A duty cycle corrector for generating from an input clock signal an output clock signal having a desired duty cycle, comprising:
    a pulse generating stage for generating from the input clock signal a pulsed clock signal, the pulse generating stage converting rising edges of the input clock signal into pulses, each of which pulses is shorter than the desired duty cycle multiplied by a clock period; and
    a pulse stretching stage for generating from the pulsed clock signal the output clock signal, the pulse stretching stage delaying falling edges of the pulsed clock signal by a controlled delay, wherein the pulse stretching stage comprises a control stage, wherein the control stage comprises
        a CMOS inverter comprising a first PMOS transistor for outputting a high and a first NMOS transistor for outputting a low, and
        a second transistor, wherein the second transistor is selected from the group consisting of a PMOS transistor, and an NMOS transistor, wherein the second transistor coupled between a source of the first PMOS transistor and a high bias potential when the second transistor is the PMOS transistor, wherein a rise time of the control stage is a function of a gate-to-source voltage at the second transistor, otherwise the second transistor coupled between a source of the first NMOS transistor and a low bias potential when the second transistor is the NMOS transistor, wherein a fall time of the control stage is a function of the gate-to-source voltage at the second transistor.

2. The duty cycle corrector as set forth in claim 1, wherein a delay of rising edges of the output clock signal relative to the rising edges of the input clock signal is independent of a duty cycle of the input clock signal.

3. The duty cycle corrector as set forth in claim 2, further comprising:
    a duty cycle detector for generating a control signal as a function of a duty cycle of the output clock signal; and
    a feedback path for delivering the control signal to the pulse stretching stage so as to increase the controlled delay when the duty cycle is less than the desired duty cycle and to decrease the controlled delay when the duty cycle is greater than the desired duty cycle.

4. The duty cycle corrector as set forth in claim 1, wherein a delay of rising edges of the output clock signal relative to the rising edges of the input clock signal is short compared to the clock period.

5. The duty cycle corrector as set forth in claim 4, further comprising:
    a duty cycle detector for generating a control signal as a function of a duty cycle of the output clock signal; and
    a feedback path for delivering the control signal to the pulse stretching stage so as to increase the controlled delay when the duty cycle is less than the desired duty cycle and to decrease the controlled delay when the duty cycle is greater than the desired duty cycle.

6. The duty cycle corrector as set forth in claim 1, wherein the pulse generating stage comprises
    a delay-and-inversion branch for delaying and inverting the input clock signal to generate an inverted and delayed input clock signal; and
    an AND gate or a NAND gate arranged to receive as first input the input clock signal and as second input the inverted and delayed input clock signal.

7. The duty cycle corrector as set forth in claim 1, wherein the pulse stretching stage comprises the control stage for generating from the pulsed clock signal a raw output clock signal, the control stage having a controllable rise time or a controllable fall time.

8. The duty cycle corrector as set forth in claim 7, wherein the pulse stretching stage further comprises a refinement stage for generating from the raw output clock signal the output clock signal.

9. The duty cycle corrector as set forth in claim 8, wherein the refinement stage comprises at least one of: an amplifier, a comparator, or a Schmitt trigger.

10. The duty cycle corrector as set forth in claim 1, further comprising:
    a duty cycle detector for generating a control signal as a function of a duty cycle of the output clock signal; and
    a feedback path for delivering the control signal to the pulse stretching stage so as to increase the controlled delay when the duty cycle is less than the desired duty cycle and to decrease the controlled delay when the duty cycle is greater than the desired duty cycle.

11. The duty cycle corrector as set forth in claim 10, wherein the duty cycle detector comprises:
    a capacitor;
    a first current source coupled so as to increase a charge of the capacitor when the output clock signal is high; and
    a second current source coupled so as to reduce the charge of the capacitor when the output clock signal is low.

12. The duty cycle corrector as set forth in claim 1, implemented as or forming part of an integrated circuit.

13. A synchronous circuit comprising the duty cycle corrector as set forth in claim 1.

14. The duty cycle corrector as set forth in claim 1, wherein the control stage comprises the second transistor, wherein the second transistor is the PMOS transistor.

15. The duty cycle corrector as set forth in claim 14, wherein the source of the first NMOS transistor is shortened to the low bias potential.

16. The duty cycle corrector as set forth in claim 1, wherein the control stage comprises the second transistor, wherein the second transistor is the NMOS transistor.

17. The duty cycle corrector as set forth in claim 16, wherein the source of the first PMOS transistor is shortened to the high bias potential.

18. A method of generating from an input clock signal an output clock signal having a desired duty cycle, comprising:
generating from the input clock signal a pulsed clock signal, by converting rising edges of the input clock signal into pulses, each of which pulses is shorter than the desired duty cycle multiplied by a clock period; and
generating from the pulsed clock signal the output clock signal, by delaying falling edges of the pulsed clock signal by a controlled delay, wherein generating from the pulsed clock signal further comprises a control stage, wherein the control stage comprises
a CMOS inverter comprising a first PMOS transistor for outputting a high and a first NMOS transistor for outputting a low, and
a second transistor, wherein the second transistor is selected from the group consisting of a PMOS transistor, and an NMOS transistor, wherein a second transistor coupled between a source of the first PMOS transistor and a high bias potential when the second transistor is the PMOS transistor, wherein a rise time of the control stage is a function of a gate-to-source voltage at the second transistor, otherwise the second transistor coupled between a source of the first NMOS transistor and a low bias potential when the second transistor is the NMOS transistor, wherein a fall time of the control stage is a function of the gate-to-source voltage at the second transistor.

19. The method as set forth in claim 18, further comprising controlling the delay so as to converge a duty cycle of the output clock signal to the desired duty cycle.

20. The method as set forth in claim 18, wherein the control stage comprises the second transistor, wherein the second transistor is the PMOS transistor.

21. The method as set forth in claim 18, wherein the control stage comprises the second transistor, wherein the second transistor is the NMOS transistor.

22. A duty cycle corrector for generating from an input clock signal an output clock signal having a desired duty cycle, comprising:
a duty cycle detector for generating a control signal as a function of a duty cycle of the output clock signal;
a pulse generating stage for generating from the input clock signal a pulsed clock signal, the pulse generating stage converting rising edges of the input clock signal into pulses, each of which pulses is shorter than the desired duty cycle multiplied by a clock period;
a pulse stretching stage for generating from the pulsed clock signal the output clock signal, the pulse stretching stage delaying falling edges of the pulsed clock signal by a controlled delay, wherein the pulse stretching stage comprises a control stage, wherein the control stage comprises
a CMOS inverter comprising a first PMOS transistor and a first NMOS transistor, and
a second transistor, wherein the second transistor is selected from the group consisting of a PMOS transistor, and an NMOS transistor, wherein the second transistor coupled between a source of the first PMOS transistor and a high bias potential when the second transistor is the PMOS transistor, otherwise the second transistor coupled between a source of the first NMOS transistor and a low bias potential when the second transistor is the NMOS transistor; and
a feedback path for delivering the control signal to the pulse stretching stage, wherein the control signal coupled to a gate of the second transistor of the control stage.

23. The duty cycle corrector as set forth in claim 22, wherein the control stage comprises the second transistor, wherein the second transistor is the PMOS transistor.

24. The duty cycle corrector as set forth in claim 22, wherein the control stage comprises the second transistor, wherein the second transistor is the NMOS transistor.

* * * * *

UNITED STATES PATENT AND TRADEMARK OFFICE
CERTIFICATE OF CORRECTION

| | | |
|---|---|---|
| PATENT NO. | : 8,552,778 B2 | Page 1 of 1 |
| APPLICATION NO. | : 13/392638 | |
| DATED | : October 8, 2013 | |
| INVENTOR(S) | : Sergey Sofer et al. | |

It is certified that error appears in the above-identified patent and that said Letters Patent is hereby corrected as shown below:

In the Claims:

Column 13, line 19, please change "wherein a second" to be --where in the second--

Signed and Sealed this
Twenty-ninth Day of July, 2014

Michelle K. Lee
*Deputy Director of the United States Patent and Trademark Office*